(12) United States Patent
Roth et al.

(10) Patent No.: US 9,996,059 B2
(45) Date of Patent: *Jun. 12, 2018

(54) VARIABLE PRECISION THERMAL SENSOR

(71) Applicant: TAIWAN SEMICONDUCTOR MANUFACTURING CO., LTD., Hsin-Chu (TW)

(72) Inventors: Alan Roth, Leander, TX (US); Eric Soenen, Austin, TX (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 689 days.

This patent is subject to a terminal disclaimer.

(21) Appl. No.: 14/604,785

(22) Filed: Jan. 26, 2015

(65) Prior Publication Data

US 2015/0142203 A1 May 21, 2015

Related U.S. Application Data

(63) Continuation of application No. 13/546,303, filed on Jul. 11, 2012, now Pat. No. 8,971,004.

(Continued)

(51) Int. Cl.
*H02H 5/04* (2006.01)
*G05B 11/01* (2006.01)
(Continued)

(52) U.S. Cl.
CPC .............. *G05B 11/01* (2013.01); *G01K 7/16* (2013.01); *G01K 15/005* (2013.01); *G05B 15/02* (2013.01); *H03M 3/344* (2013.01); *H03M 3/458* (2013.01)

(58) Field of Classification Search
USPC .......................................................... 361/103
See application file for complete search history.

(56) References Cited

U.S. PATENT DOCUMENTS

5,465,268 A 11/1995 Rainbolt
6,014,611 A * 1/2000 Arai .................. G06F 1/206
702/132

(Continued)

OTHER PUBLICATIONS

Notice of Allowance issued in counterpart U.S. Appl. No. 13/481,990, filed May 29, 2012.

*Primary Examiner* — Ronald W Leja
(74) *Attorney, Agent, or Firm* — Duane Morris LLP

(57) ABSTRACT

A high accuracy on-chip thermal sensor includes an integrated circuit and sensing elements. The thermal sensor finds application in various mobile and battery powered devices and includes a processor that analyzes a measured temperature signal and decides if the thermal sensor operates in low or high power operational mode, or if the device's CPU is to be reset. A method utilizing the thermal sensor includes making comparisons to two threshold temperatures and operating at low power mode below the first threshold temperature, high power mode between the two threshold temperatures and causing reset if the second threshold temperature is exceeded. Low power operational mode includes a lower clock frequency, lower bias current and lower power consumption. Higher power operational mode is used when the upper threshold temperature is being approached and includes a higher data sampling frequency and more accurate temperature control and uses higher power.

19 Claims, 3 Drawing Sheets

Related U.S. Application Data

(60) Provisional application No. 61/565,082, filed on Nov. 30, 2011, provisional application No. 61/564,940, filed on Nov. 30, 2011, provisional application No. 61/565,306, filed on Nov. 30, 2011.

(51) Int. Cl.
  *G01K 7/16* (2006.01)
  *G01K 15/00* (2006.01)
  *H03M 3/00* (2006.01)
  *G05B 15/02* (2006.01)

(56) References Cited

U.S. PATENT DOCUMENTS

| | | | |
|---|---|---|---|
| 6,225,926 | B1 | 5/2001 | Hayase |
| 6,470,289 | B1 * | 10/2002 | Peters .................. G01K 7/42 374/10 |
| 6,956,516 | B2 | 10/2005 | Furuichi |
| 7,464,277 | B2 * | 12/2008 | Prosperi .................. G06F 1/206 713/300 |
| 7,629,915 | B2 | 12/2009 | Lin |
| 7,646,659 | B2 | 1/2010 | Sako |
| 7,733,995 | B2 | 6/2010 | Usui |
| 7,898,448 | B2 | 3/2011 | Murakami |
| 7,990,304 | B2 | 8/2011 | Lim et al. |
| 8,118,483 | B2 | 2/2012 | Cox |
| 8,272,781 | B2 | 9/2012 | Nale |
| 8,299,646 | B2 | 10/2012 | Rockenfeller et al. |
| 8,684,597 | B2 | 4/2014 | Cox |
| 8,971,004 | B2 * | 3/2015 | Roth .................. G01K 7/16 361/103 |
| 2005/0001670 | A1 | 1/2005 | Kim et al. |
| 2005/0259496 | A1 | 11/2005 | Hsu et al. |
| 2006/0066384 | A1 | 3/2006 | Jain et al. |
| 2006/0176052 | A1 | 8/2006 | Seo |
| 2007/0152865 | A1 | 7/2007 | Melanson |
| 2008/0007319 | A1 | 1/2008 | Cox |
| 2008/0043556 | A1 | 2/2008 | Nale |
| 2009/0313313 | A1 | 12/2009 | Yokokawa et al. |
| 2010/0331039 | A1 | 12/2010 | Hezar |
| 2012/0249770 | A1 | 10/2012 | Hamm et al. |
| 2013/0135131 | A1 | 5/2013 | Tai et al. |
| 2013/0135782 | A1 | 5/2013 | Roth et al. |
| 2013/0136149 | A1 | 5/2013 | Soenen et al. |

* cited by examiner

VARIABLE PRECISION THERMAL SENSOR

RELATED APPLICATIONS

The present application is a continuation of pending U.S. patent application Ser. No. 13/546,303, filed on Jul. 11, 2012, entitled "VARIABLE PRECISION THERMAL SENSOR," and which claimed priority to U.S. Provisional Patent Application No. 61/565,082 filed Nov. 30, 2011 and entitled "Idle Tone Suppression Circuit," U.S. Provisional Patent Application No. 61/564,940 filed Nov. 30, 2011 and entitled "Two-Point Calibration of Integrated Thermal Sensor," and U.S. Provisional Patent Application No. 61/565,306 filed Nov. 30, 2011 and entitled "On Demand Variable Precision Thermal Sensor," each of which is hereby incorporated by reference in their entirety.

TECHNICAL FIELD

The disclosure relates to thermal sensors and temperature sensing methods.

BACKGROUND

Electronic devices are prevalent in all aspects of today's world. These electronic devices typically include a number of individual chips. The operating system typically includes a primary CPU, central processing unit, and the chips are typically formed of silicon or other semiconductor materials. Temperature control must be maintained in the chips to avoid overheating and malfunctioning of the chip and therefore the entire electronic device. This is especially true for mobile and battery powered electronic devices. Temperature elevation can be the result of a high ambient temperature or due to operation of the device itself. Advances in technology enable the devices formed on the chips to operate at increased speeds and with increased power levels. These increased speeds and power levels can cause the temperature in the chip to become elevated.

Temperature sensors find utility in monitoring the temperature of these chips. The temperature information may be fed to a processor or other device and corrective action may be required and carried out. High accuracy temperature sensors and temperature sensors with fast response times require high accuracy analog circuits. These high accuracy analog circuits consume much higher power than their lower accuracy counterparts.

It would be desirable to provide high accuracy temperature sensing with fast response times in a temperature sensor that consumes a reduced amount of power.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
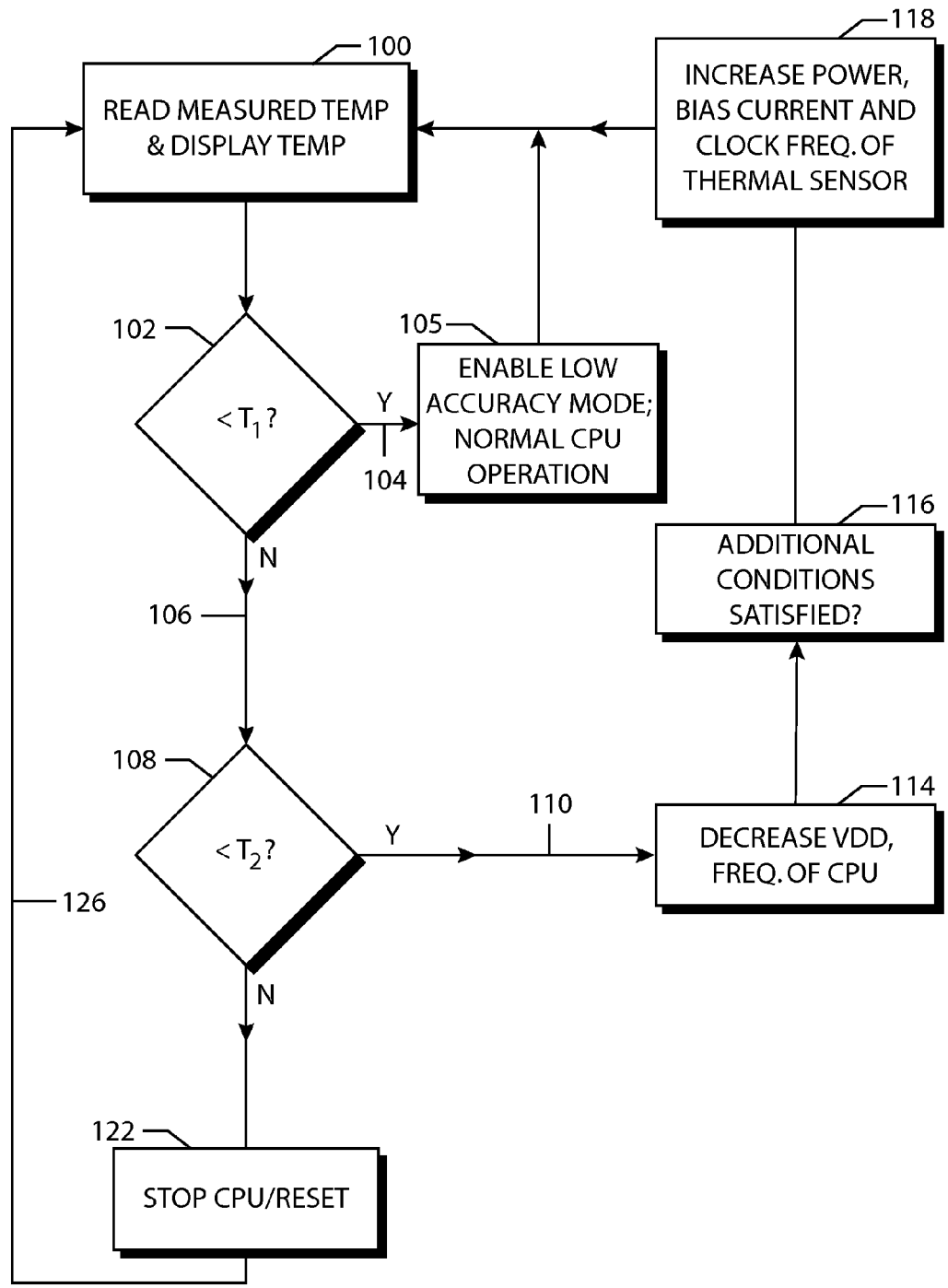
FIG. 1 is a flowchart illustrating aspects of the disclosure.

An on-chip thermal sensor (thermometer) and method for monitoring temperature, are provided. The on-chip thermal sensor finds various applications in mobile and battery-powered devices which benefit from accurately monitored temperatures. The disclosed on-chip thermal sensors are used for cell phone type applications, in other PDA (personal digital assistant) devices, laptop computers, or in various other portable, hand-held devices or in any of various other electronic devices or components. Various other chips and other components are included in the mobile or other electronic device or component in which the thermal sensor is included. In various embodiments, the disclosed thermal sensor provides the following features: a trimming method; the use of variable precision (low/high power) modes to monitor temperature; and an idle tone killer for data sampling, to monitor temperature.

The on-chip thermal sensor (thermometer) and method monitor temperature accurately. In various embodiments, the thermal sensor for the electronic device is on the silicon or other chip which is the CPU, central processing unit of the electronic device and in other embodiments the thermal sensor is used to monitor/measure temperature on another chip or the battery. Temperature variation may be attributed to use of the electronic device, or the temperature of the ambient environment. The different chips of an electronic device which is being monitored, have different desired operating temperature ranges in some embodiments and have the same desired operating temperature ranges in many other embodiments.

The disclosure provides variable precision temperature sensors, i.e. variable precision thermal sensors. The disclosure also provides a system including the thermal sensor and an associated processor, for sensing and controlling the temperature and operational mode of the thermal sensor itself. A method for sensing and controlling temperature in an electronic device is also provided. The thermal sensors operate in both a high power operational mode and a low power operational mode. In the high power operational mode, more power is used, relatively higher accuracy is provided and more frequent sampling is carried out. A reduced response time for making temperature corrections is achieved in high power mode, i.e. corrections are made more quickly. In the low power operational mode, relatively less accuracy is achieved and the temperature sensing frequency is less but power consumption levels are lower. The lower power consumption levels associated with the low power operational mode enhance device performance and advantageously extend the life of the electronic component. The disclosed variable precision thermal sensor itself detects when temperature is reaching its safety threshold and can automatically switch itself between the low power operational mode and the high power operational mode, and can also turn off the electronic device in which it is incorporated, when a critical temperature is exceeded.

The thermal sensor works in conjunction with a processor that carries out logic functions associated with the measured temperature. The signal representing the measured temperature is processed by the processor which uses an algorithm that performs controls and takes corrective action or sends a signal to a component that takes corrective action such as by powering down the electronic device or changing operational characteristics to suppress the increasing operating temperature. The processor also automatically controls the operational mode of the thermal sensor itself. The processor may be a microprocessor and is the CPU, central processing unit of the electronic device, in one embodiment. The thermal sensor circuit may be included as part of the processor which is a CPU, central processing unit of the device, in many embodiments. In some embodiments, the signal of the monitored temperature is sent to a separate processor which performs controls and automatically takes corrective action or directs corrective action to be taken. In some embodiments, the integrated circuit of the on-chip thermal sensor itself includes a block of logic circuitry that serves as the processor that processes the signal of the monitored temperature and which uses an algorithm that automatically performs controls and takes corrective action or directs corrective action to be taken. In some embodiments described below, the value of the digital output code of the thermal sensor itself is actually used by the processor.

In one embodiment, there are two threshold temperatures. In this embodiment, a lower threshold temperature is the temperature that represents the switching point between the low power operational mode and the high power operational mode. When the measured temperature increases from a temperature below the lower threshold temperature to a temperature that exceeds the lower threshold temperature, the operational mode of the thermal sensor is automatically switched from low power operational mode to high power operational mode to get more accurate and more frequent data as an upper threshold temperature is approached. The converse is also true. The upper threshold temperature represents a shutdown temperature, i.e. when a temperature above the upper threshold temperature is detected, the processor shuts itself and/or other components of the device, down.

In some embodiments, operating characteristics of the CPU of the electronic device are also switched when the system switches between the low and high power operational modes and/or when a higher threshold temperature is exceeded. In one embodiment, the operating Vdd and clock frequency of the CPU are changed.

In order to avoid thrashing between the low power operational mode and the high power operational mode, a hysteresis is built into the system of the thermal sensor in various embodiments. Various hysteresis are used. In one embodiment, the hysteresis requires a prescribed temperature change in time before the system switches from low power operational mode to high power operational mode or vice versa. In another embodiment, the hysteresis requires an overall temperature change greater than a prescribed value, before the system switches from low power operational mode to high power operational mode or vice versa.

The disclosed temperature sensor includes a sensing element in an integrated circuit. Various sensing elements are available and are used in various embodiments. In some embodiments, a plurality of semiconductor transistors are arranged to give an analog or digital voltage representative of the temperature of the substrate upon which the transistors are formed. Other temperature sensing elements are used in other embodiments. Various integrated circuit arrangements are used in various embodiments. The integrated circuits include analog blocks and components in various embodiments.

In some embodiments, the thermal sensor is based on the measurement of the voltage across a thermal diode. The diode is forward biased by a controlled reference current in some embodiments. The voltage across the diode provides an indication of temperature. In some embodiments, the relationship between diode temperature and voltage is approximately linear and in some embodiments the diode voltage is converted by an analog to digital Converter (ADC).

The thermal sensor can be calibrated based on a one-point or two-point measurement or other techniques. Various calibration techniques are used in various embodiments.

The thermal sensor is operable in high power and low power operational modes. In high power operational mode, the bias currents of analog blocks such as thermal diodes, band gap circuits, operating amps, and analog-to-digital converters are at a relatively high level, producing a higher accuracy of the measured temperature. Also in high power operational mode, the clock frequency and the analog bandwidth of the analog-to-digital converter are greater such that the speed in the response time of the temperature change is increased. Higher power levels are consumed.

In low power operational mode, the bias currents of analog blocks such as thermal diodes, band gap circuits, operating amps, and analog-to-digital converters are at a relatively low level, producing a lower accuracy of the measured temperature. Also in low power operational mode, the clock frequency and the analog bandwidth of the analog-to-digital converter are less such that the speed in the response time of the temperature change is decreased. Lower power levels are consumed.

Various sensing elements and thermal sensor integrated circuits are used in various embodiments of the disclosure. FIG. 1 is a flowchart illustrating aspects of the disclosure. One embodiment of a thermal sensing method of the disclosure is shown in FIG. 1 and it should be understood that the thermal sensor integrated circuit may be incorporated within a processor with logic functions that execute the steps shown in FIG. 1. In other embodiments, the thermal sensor integrated circuit provides a signal to an external processor with logic functions that carries out the steps illustrated in FIG. 1. In still other embodiments, the thermal sensor integrated circuit itself includes logic circuitry that carries out the steps illustrated in FIG. 1. The processor with the logic circuitry is the CPU of the device in some embodiments.

Figure 2A:
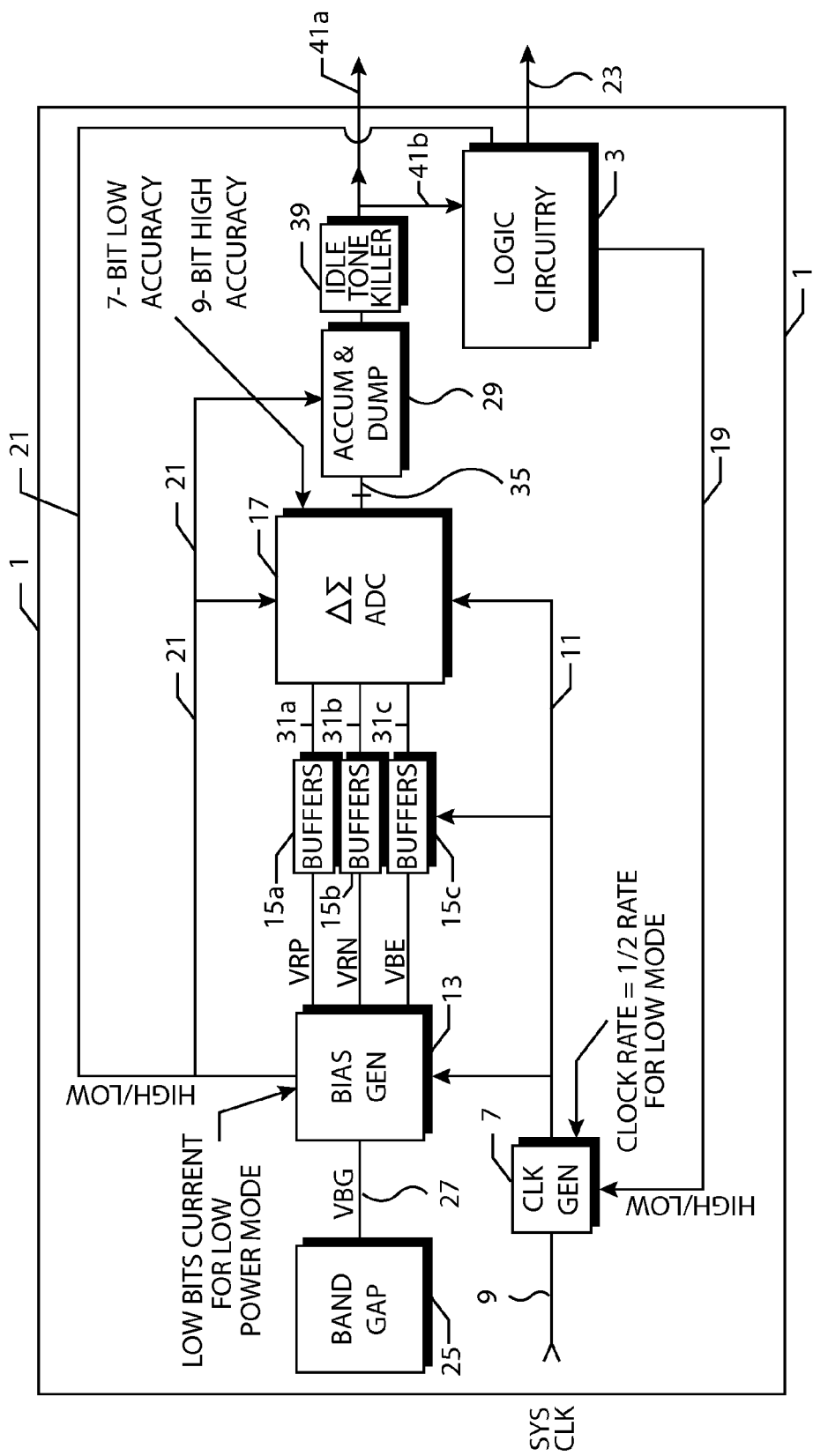
FIGS. 2A and 2B are block diagrams each showing a schematic layout of components of the thermal sensor of the disclosure.
Figure 2B:
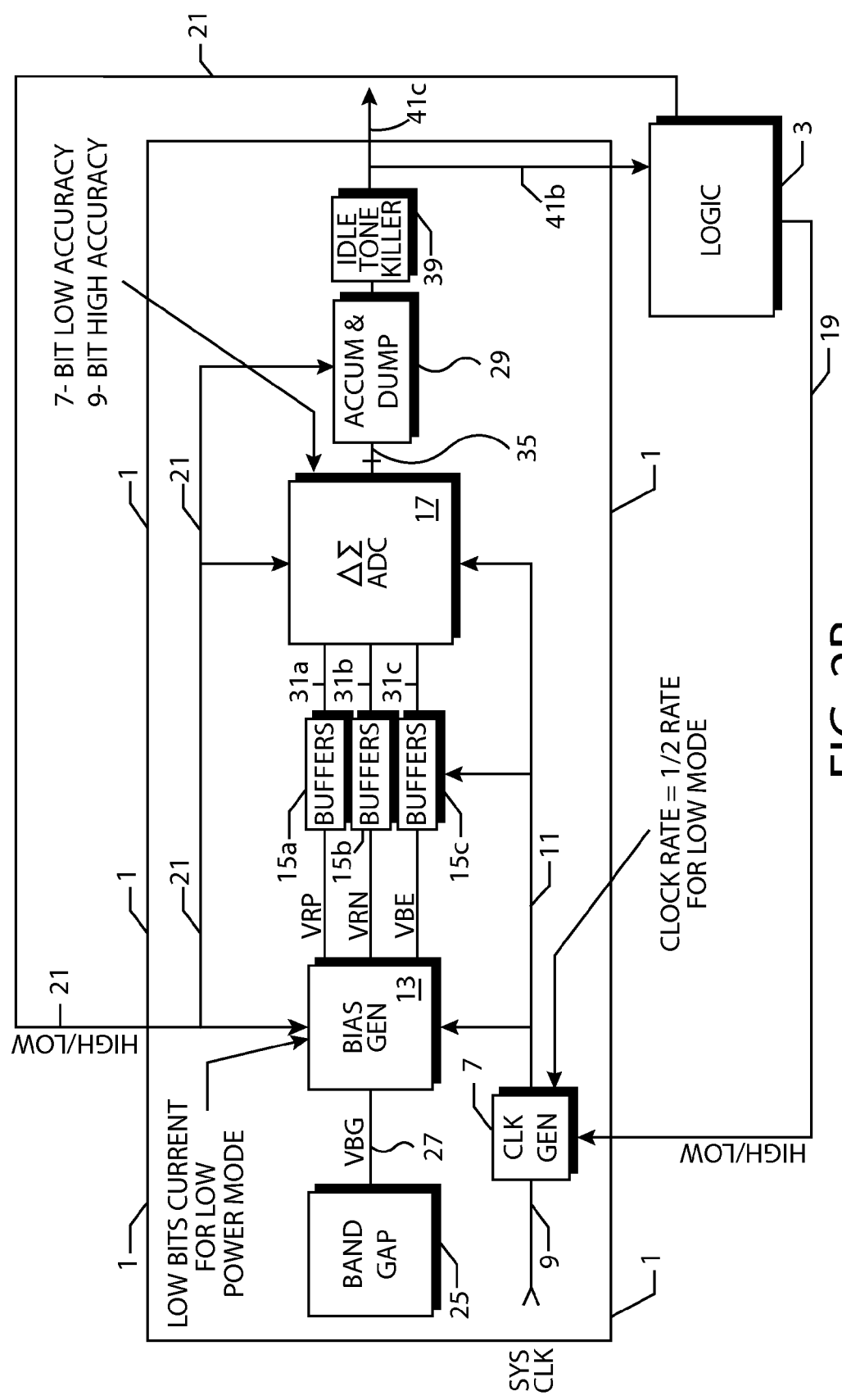

FIGS. 2A and 2B are block diagrams that illustrate embodiments of a thermal sensor integrated circuit of the disclosure.

FIGS. 2A and 2B each illustrate an embodiment of a thermal sensor integrated circuit 1. Thermal sensor integrated circuit 1 is a component in various mobile electronic devices as described above. Each of these electronic devices includes various other features and components including a central processing unit, CPU, which includes thermal sensor integrated circuit 1 in some embodiments. Each of FIGS. 2A and 2B illustrates a schematic that shows logic circuitry that processes the measured temperature signal of the thermal sensor. The measured temperature signal represents the temperature of the silicon or other chip or other component upon which thermal sensor integrated circuit 1 is disposed. The logic circuitry uses an algorithm to automatically control the operational mode (low power or high power) of thermal sensor integrated circuit 1.

Returning to FIG. 1, Step 100 provides for reading the measured temperature signal and displaying the measured temperature. The measured temperature signal is an output provided by the thermal sensor. The thermal sensor is an integrated circuit formed on a chip in various embodiments and includes a sensing element or sensing elements. In one embodiment, the sensing element is a plurality of transistors, but other sensing elements, including but not limited to the previously described sensing elements, are used in other embodiments. Various displays are used to provide a digital display of the temperature on the electronic device and various means are used to select the temperature display.

The measured temperature signal is read by the logic circuitry that uses an algorithm to carry out the functions shown in the flowchart of FIG. 1. The sampling frequency of the measured temperature signal varies in various embodiments and is determined by the clock frequency of the thermal sensor integrated circuit. The logic circuitry is in a processor that may be part of, or external to the thermal sensor integrated circuit (please refer to FIGS. 2A and 2B). At Step 102, the measured temperature signal is compared to a first threshold temperature, $T_1$. At Step 102, a check is made to see if the measured temperature is less than the first threshold temperature $T_1$. The frequency of the measured temperature signal delivered to the logic circuitry varies in various embodiments. If YES (104), the system continues reading and displaying the measured temperature and the system operates in low power mode. At Step 105, the low power/lower accuracy mode is enabled and the CPU/electronic device continues in normal operation mode.

If NO (106), the first threshold temperature $T_1$ is exceeded. At Step 108, the measured temperature signal is compared to a second threshold temperature $T_2$. More particularly, it is decided if the measured temperature is less than $T_2$. If YES (110), a signal is sent to decrease Vdd and the operating frequency of the CPU at Step 114. This is done automatically by the logic circuitry. At Step 114, the control signal causes a decrease in the operating frequency of the CPU/electronic device and also a decrease in the Vdd. Thus, the operating conditions of the electronic device itself are altered to decrease the temperature of the device or at least suppress the increase in temperature in the device as the temperature approaches temperature $T_2$. Stated alternatively, when the measured temperature signal traverses the second threshold temperature $T_2$, the logic circuitry of the thermal sensor switches the operational mode of the thermal sensor from low to high power operational mode if additional conditions are satisfied at Step 116.

At Step 116, it is determined if other conditions necessary for switching from low power operational mode to high power operational mode, are met. For example, a lag time may be built in to see if other conditions are met. One such other condition may be a determination as to whether a prescribed rate of temperature change has been achieved for a prescribed time or whether the overall change in temperature since the last reading exceeds a certain value. In one embodiment, that value is 5° C., but other temperature values are used in other embodiments. In other embodiments, various other hysteresis may be built into the system and evaluated at Step 116. Various other hysteresis may be used to ensure that the changes in the temperature signal are not spurious or otherwise inaccurate and not representative of an actual temperature change. If the conditions are met, Step 118 represents switching the thermal sensor circuitry from a low power operational mode to a high power operational mode that includes an increased power, bias current and higher clock frequency to obtain a more accurate and more frequent temperature reading as the critical temperature $T_2$ is being approached.

In some embodiments, the thermal sensor integrated circuit components include analog components and the analog components operate with a lower bias current in low power operational mode and a higher bias current in high power operational mode. The clock frequency of the thermal sensor integrated circuit is increased in high power operational mode and the increase is a 2× increase of the original frequency in one embodiment. Other clock frequency changes are used in other embodiments. In some embodiments, the thermal sensor integrated circuit includes an analog-to-digital convertor (ADC) and the operational bandwidth of the ADC is lower in low power operational mode and higher in high power operational mode. High power operational mode generally involves the thermal sensor providing more accurate and more frequent temperature data as is beneficial when the second threshold temperature $T_2$ is being approached. When the measured temperature is not above the first threshold temperature $T_1$ and the thermal sensor integrated circuit is operating in low power operational mode, power consumption is decreased.

At Step 108, if it is determined that the measured temperature exceeds the second threshold temperature $T_2$, (i.e. "NO") then at Step 122, the CPU of the electronic device is turned off and reset preventing failure or destruction of the CPU and the associated electronic device.

Various temperatures are used for first and second threshold temperatures, $T_1$ and $T_2$. The assigned values of temperatures $T_1$ and $T_2$ vary depending on the particular device in which the thermal sensor is incorporated, the application of the device and the particular chip of the device on which the thermal sensor is disposed. The thermal sensor may be incorporated into various electronic devices such as mobile devices such as laptop computers, cellular telephones, and other handheld or mobile computing devices and the threshold temperatures are determined by the operational characteristics of the particular electronic device and the type of electronic device. In one embodiment, first threshold temperature $T_1$ is 55° C., with second threshold temperature $T_2$ being set at 85° C., but such temperatures merely represent an example of the various temperatures that may be used.

FIG. 2A shows thermal sensor integrated circuit 1 according to one embodiment in which logic circuitry 3 is a processor contained within thermal sensor integrated circuit 1. FIG. 2B shows an embodiment in which logic circuitry 3 is a processor external to thermal sensor integrated circuit 1. Such designations are arbitrary and it should be understood that thermal sensor integrated circuit 1 in conjunction with logic circuitry 3 carries out the steps shown in the flowchart of FIG. 1 and logic circuitry 3 may be included in any of various processors coupled to and having various relationships with thermal sensor integrated circuit 1. Logic circuitry 3 and thermal sensor integrated circuit 1 are part of the CPU in one embodiment, that is, logic circuitry 3, and thermal sensor integrated circuit 1 are formed on the same chip as the CPU of the electronic device.

The following description of the components of thermal sensor integrated circuit 1 represented as a block diagram, apply to both FIGS. 2A and 2B. It should be noted that the components and arrangement of components in the block diagrams of FIGS. 2A and 2B represent one embodiment and that various other arrangements and circuits are used in the embodiments.

Each of the components described herein combine to form thermal sensor integrated circuit 1. The components are formed using various semiconductor manufacturing processing operations and are all formed on a silicon chip in one embodiment. In other embodiments, the components of thermal sensor integrated circuit 1 and logic circuitry 3 are formed on other substrates and thermal sensor integrated circuit 1 and logic circuitry 3 may be formed on the same or different chips in various embodiments. Logic circuitry 3 determines if thermal sensor integrated circuit 1 operates in low power operational mode or high power operational mode or if the CPU of the electronic device is to be re-set or turned off. High power operational mode includes a higher bias current for the components of thermal sensor integrated circuit 1 and a higher clock rate.

Logic circuitry 3 determines if thermal sensor integrated circuit 1 operates in low power operational mode with clock control signal 19 being a relatively low frequency signal, or if thermal sensor integrated circuit 1 operates at high power mode with clock control signal 19 being a relatively higher clock frequency or if the CPU running the electronic device in which thermal sensor integrated circuit 1 is contained, should be stopped or reset using stop/reset signal 23. Stop/reset signal 23 is sent to the CPU or other switch element that turns off the CPU and/or the overall electronic device. Each of these operational modes are shown in FIG. 1. Clock control signal 19 is delivered from logic circuitry 3 to clock generator 7 and establishes the clock rate, i.e. lower in low power mode and higher in high power mode.

Clock generator 7 also receives system clock signal 9 which may come from an off-chip crystal such as an oscillator. Clock generator 7 produces system clock signal 11 to various system components such as bias generator 13, buffers 15A-15C and analog-to-digital convertor 17. Clock signal 11 includes a timing signal that takes on various values in various embodiments. According to one embodiment, the clock rate as evidenced by clock signal 11 takes on at least two values: a high clock frequency in high power operational mode and a low clock frequency in low power operational mode. In one embodiment, the clock frequency in the high power operational mode is two times as fast as the clock frequency in the low power operational mode but various relative clock frequencies are used in other embodiments. In other embodiments, multiple clock frequencies are used. The clock frequency is representative of the data sampling frequency.

Logic circuitry 3 also directs bias current signal 21 to bias generator 13. Bias current signal 21 directs bias generator 13 to operate at low power operational mode with a lower bias current or high power operational mode with a higher bias current. Bias current signal 21 is also provided to analog-to-digital converter (ADC) 17 and accumulation/dump block 29.

Band gap block 25 is provided. Band gap block 25 generates $V_{bias}$ signal 27 to bias generator 13. In one embodiment, bias generator 13 includes a large resistor string. In one embodiment, $V_{bias}$ signal 27 goes into the head of the resistor string and generates voltage level signals $V_{RP}$ (voltage reference positive), $V_{RN}$ (voltage reference negative) and the $V_{BE}$ (voltage base to emitter) to buffers 15A, 15B and 15C, respectively. In one embodiment, $V_{BE}$ is a voltage corresponding to measured temperature and signals $V_{RP}$ and $V_{RN}$ are temperature independent. The previously described sensing elements of the disclosed thermal sensor, are included within the components of band gap block 25 or bias generator 13 in various embodiments.

In some embodiments, the resistors of the resistor string in bias generator 13 may include process variations. Bias signals $V_{RP}$ and $V_{RN}$ may be adjusted within bias generator 13 to compensate for such variations, using various means.

Buffers 15a-15c include a DC offset in some embodiments. In some embodiments, buffers 15a-15c serve as analog amplifiers, e.g. operational amplifiers. Signals 31a-31c are sent to ADC 17 which includes output signal 35. In some embodiments, the output code of output signal 35 is a 7 bit low accuracy signal in low power operational mode and a 9 bit high accuracy signal in high power operational mode. The circuit then accumulates and dumps at accumulation/dump block 29 and optional idle tone killer 39 is a hysteresis element that removes artifacts from the digital signal.

Measured temperature signal 41a is delivered to various system components such as a display and measured temperature signal 41b is directed to logic circuitry 3 which notes the value of the measured temperature, and the rate of change of the measured temperature and determines if low power operational mode or high power operational mode will be used or if the CPU of the electronic device is to be stopped and reset. These steps are shown in FIG. 1. Alternatively stated, logic circuitry 3 determines and directs switching between the aforementioned lower power/high power/reset modes.

In one embodiment, a method for monitoring temperature in an electronic device is provided. The method comprises: providing a thermal sensor in an electronic component; delivering a signal representative of measured temperature from the thermal sensor to a processor; determining if the measured temperature is above a lower threshold temperature and if the measured temperature is above an upper threshold temperature; operating the thermal sensor at a low power operational mode if the measured temperature is below the lower threshold temperature; operating the thermal sensor at a high power operational mode if the measured temperature is above the lower threshold temperature but below the upper threshold temperature; and shutting down the electronic component if the measured temperature is above the upper threshold temperature.

In another embodiment, a method for sensing temperature is provided. The method comprises: providing a thermal sensor in an electronic device, the thermal sensor including an integrated circuit including analog components, wherein at least the analog components are operable at a low power operational mode that operates at a lower bias current and at a high power operational mode that operates at a higher bias current; delivering a signal indicative of temperature from the thermal sensor to a processor; determining when the signal traverses a threshold temperature; switching from one of the low power operational mode and the high power operational mode, to the other of the low power operational mode and the high power operational mode if at least one condition is met, the at least one condition including the output signal traversing the threshold temperature; and shutting down the electronic device if the output signal traverses a further threshold temperature being greater than the threshold temperature.

In one embodiment, a thermal sensor is provided. The thermal sensor comprises: a thermal sensor integrated circuit including analog components and a sensing element; a low power operational mode in which at least the analog components operate at lower bias currents; a high power operational mode in which the at least the analog components operate at higher bias currents; an output signal deliverable from the thermal sensor integrated circuit and representative of measured temperature; and a processor that receives the output signal, determines if the low power operational mode or the high power operational mode should be used based on the output signal, and directs the at least the analog components to operate at one of the low power operational mode and the high power operational mode.

In yet another embodiment, a system for monitoring temperature in an electronic device or component is provided. The system comprises: an electronic device or component; a thermal sensor that produces a signal representative of measured temperature, disposed in the electronic device or component; a low power operational mode; a high power operational mode; a processor that processes the signal and determines if the measured temperature is above a lower threshold temperature. If the measured temperature is above an upper threshold temperature, the processor causes the thermal sensor to operate at the low power operational mode if the measured temperature is below the lower threshold temperature; causes the thermal circuit to operate at the high power operational mode if the measured temperature is above the lower threshold temperature but below the upper threshold temperature; and, shuts down the electronic device component if the measured temperature is above the upper threshold temperature.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method comprising:
    providing a thermal sensor in an electronic component having a first processor;
    delivering a signal representative of measured temperature from the thermal sensor to a second processor;
    operating the first processor at a first Vdd and a first operating frequency if the measured temperature is below a first threshold temperature;
    operating the first processor at a second Vdd and a second operating frequency if the measured temperature is above the first threshold temperature but below a second threshold temperature higher than the first threshold temperature, wherein the second Vdd is lower than the first Vdd and the second operating frequency is lower than the first operating frequency;
    operating the thermal sensor in a low power operational mode if the measured temperature is below the first threshold temperature; and
    operating the thermal sensor in a high power operational mode if the measured temperature is above the first threshold temperature and below the second threshold temperature.

2. The method of claim 1, further comprising determining a threshold rate of temperature change with respect to time, wherein the first processor switches to one of the first Vdd and the first operating frequency or the second Vdd and the second operating frequency only if the threshold rate of temperature change with respect to time exceeds a predetermined value.

3. The method of claim 2, wherein the thermal sensor comprises an integrated circuit including one or more analog components, wherein operating the thermal sensor in the low power operational mode comprises operating the analog components using a first bias current, and wherein operating the thermal sensor in the high power operational mode comprises operating the analog components using a second bias current, wherein the second bias current is higher than the first bias current.

4. The method of claim 3, wherein the integrated circuit further comprises a sensor element comprising a plurality of transistors and an analog-to-digital convertor, and wherein switching to one of the first Vdd and the first operating frequency or the second Vdd and the second operating frequency comprises changing an operational bandwidth of the analog-to-digital convertor.

5. The method of claim 1, wherein operating the thermal sensor in the low power operational mode includes operating the thermal sensor at a first clock frequency and operating the thermal sensor in the high power operational mode includes operating the thermal sensor at a second clock frequency, wherein the second clock frequency is higher than the first clock frequency.

6. The method of claim 1, further comprising turning off the first processor if the measured temperature is above the upper threshold temperature.

7. The method of claim 1, wherein the second processor includes one or more logic circuits integrated into the first processor.

8. A method comprising:
    providing a thermal sensor in an electronic device;
    delivering a signal indicative of a temperature from the thermal sensor to a processor;
    determining if the signal traverses a signal value representing a threshold temperature; and
    switching the thermal sensor from one of a low power operational mode or a high power operational mode to the other of the low power operational mode or high power operational mode when at least one condition is met, wherein the at least one condition includes the output signal traversing the signal value representing threshold temperature.

9. The method of claim 8, wherein switching the thermal sensor includes switching a clock frequency of the thermal sensor.

10. The method of claim 8, wherein the thermal sensor comprises one or more analog components, and wherein switching the thermal sensor includes altering a bias current of the one or more analog components.

11. The method of claim 8, wherein the at least one condition includes the temperature exceeding a predetermined temperature range.

12. A sensor comprising:
a thermal sensor integrated circuit comprising analog components and a sensing element;
the thermal sensor integrated circuit being operable in a low power operational mode in which the analog components operate at a first bias current;
the thermal sensor integrated circuit being operable in a high power operational mode in which the analog components operate at a second bias current, wherein the second bias current is higher than the first bias current;
the thermal sensor integrated circuit configured to provide an output signal representative of a measured temperature; and
a processor that receives the output signal and directs the analog components to switch from one of the low power operational mode and the high power operational mode to the other of the low power operational mode and the high power operational mode if a threshold rate of temperature change with respect to time of the measured temperature is exceeded.

13. The thermal sensor of claim 12, wherein the processor determines if the low power operational mode or the high power operational mode should be used, based at least upon whether the output signal indicates the measured temperature is above a first threshold temperature.

14. The thermal sensor of claim 12, wherein the processor further determines if the output signal indicates the measured temperature is above a second threshold temperature and shuts itself off if the second threshold temperature is exceeded.

15. The thermal sensor of claim 12, wherein the analog components include an analog-to-digital convertor configured to operate at a first bandwidth in the low power operational mode and a second bandwidth in the high power operational mode, and wherein the second bandwidth is higher than the first bandwidth.

16. The thermal sensor of claim 12, wherein the thermal sensor integrated circuit further comprises a clock generator, wherein clock generator operates at a first clock rate in the low power operational mode and a second clock rate in the high power operational mode, and wherein the second clock rate is faster than the first clock rate.

17. The thermal sensor of claim 12, wherein the thermal sensor is disposed within an electronic component, wherein the processor is a processor of the electronic component, and wherein the integrated circuit is disposed within a chip that contains the processor of the electronic component.

18. The thermal sensor of claim 17, wherein the electronic component comprises a cellular telephone.

19. The thermal sensor of claim 12, wherein the processor is configured to determine whether to switch from one of the low power operational mode and the high power operational mode to the other of the low power operational mode and the high power operational mode based on whether the output signal indicates a temperature above a threshold temperature and whether the output signal indicates a rate of temperature change that exceeds a threshold rate of temperature change for a prescribed time.

\* \* \* \* \*